(12) United States Patent
Chadwick et al.

(10) Patent No.: US 8,943,458 B1
(45) Date of Patent: Jan. 27, 2015

(54) DETERMINING CHIP BURN-IN WORKLOAD USING EMULATED APPLICATION CONDITION

(71) Applicant: International Business Machines Corporation, Armonk, NY (US)

(72) Inventors: Nathaniel R. Chadwick, Lowell, MA (US); Frances S. M. Clougherty, South Burlington, VT (US); William P. Hovis, Rochester, MN (US); Kirk D. Peterson, Jericho, VT (US); Mack W. Riley, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/027,594

(22) Filed: Sep. 16, 2013

(51) Int. Cl.
*G06F 17/50* (2006.01)
(52) U.S. Cl.
CPC ................................ *G06F 17/5068* (2013.01)
USPC ............................ 716/136; 716/112; 716/113
(58) Field of Classification Search
USPC ......................................... 716/112–113, 136
See application file for complete search history.

(56) References Cited

U.S. PATENT DOCUMENTS

| 5,457,400 | A | 10/1995 | Ahmad et al. | |
|---|---|---|---|---|
| 6,455,336 | B1 | 9/2002 | Berndlmaier et al. | |
| 6,714,032 | B1 * | 3/2004 | Reynick | 324/762.02 |
| 6,959,262 | B2 * | 10/2005 | Curry, III | 702/183 |
| 7,120,842 | B2 * | 10/2006 | Barevadia et al. | 714/726 |
| 7,177,864 | B2 * | 2/2007 | Ekhaus | 707/776 |
| 7,269,766 | B2 * | 9/2007 | Slobodnik et al. | 714/718 |
| 8,560,779 | B2 * | 10/2013 | Castillo et al. | 711/138 |
| 2005/0166115 | A1 | 7/2005 | Daume et al. | |
| 2008/0219069 | A1 | 9/2008 | Arsovski et al. | |
| 2009/0099828 | A1 | 4/2009 | Arsovski et al. | |
| 2010/0083203 | A1 * | 4/2010 | Bose et al. | 716/6 |
| 2011/0054840 | A1 * | 3/2011 | Hively et al. | 702/182 |
| 2012/0035917 | A1 * | 2/2012 | Kim et al. | 704/200.1 |
| 2012/0297145 | A1 * | 11/2012 | Castillo et al. | 711/138 |
| 2013/0096902 | A1 * | 4/2013 | Bose et al. | 703/14 |
| 2013/0282334 | A1 * | 10/2013 | Diperna et al. | 702/183 |

* cited by examiner

*Primary Examiner* — Naum B Levin
(74) *Attorney, Agent, or Firm* — Michael J. LeStrange; Hoffman Warnick LLC

(57) ABSTRACT

Various embodiments include approaches for determining burn-in workload conditions for an integrated circuit (IC) design. Some embodiments include burn-in testing the IC design using the workload conditions. In some embodiments, a computer implemented method includes obtaining survey data about at least one application workload for an integrated circuit (IC) corresponding to an IC design; generating latch state and clocking statistics about the IC design for the at least one application workload based upon the survey data; and determining a set of burn-in workload conditions for the IC design based upon the latch state and clocking statistics about the IC design.

20 Claims, 4 Drawing Sheets

| circuits | Application 1 (low bound) | Application 2 (high bound) | Application N | Burn In Conditions (low bound) | Burn In Conditions (high bound) |
|---|---|---|---|---|---|
| 1 | 10% | 90% | 40% | 10% | 90% |
| 2 | 20% | 95% | 70% | 20% | 95% |
| 3 | 1% | 1% | 1% | 1% | 1% |
| 4 | 15% | 70% | 50% | 15% | 70% |
| 5 | 25% | 60% | 40% | 25% | 60% |
| . | | | | | |
| . | | | | | |
| . | | | | | |
| n | | | | | |

FIG. 3

DETERMINING CHIP BURN-IN WORKLOAD USING EMULATED APPLICATION CONDITION

TECHNICAL FIELD

Aspects of the invention relate generally to integrated circuits. More particularly, various aspects of the invention relate to testing integrated circuits under emulated application conditions.

BACKGROUND

Burn-in is known in the art of integrated circuits (ICs) as a test method used to stress an IC to detect early-life failures in the circuit, and provide a measure of performance reliability. However, during the stress-inducing process of burn-in, patterns used to exercise an IC (e.g., a microprocessor) in manufacturing are not necessarily representative of how that IC is exercised in the field (e.g., in use for one or more applications). This mismatch between field usage and burn-in leads to unrealistic stressing in the test phase, which can over-stress or under-stress the circuit.

BRIEF SUMMARY

Various embodiments include approaches for determining a chip burn-in based upon emulated application conditions. In particular, various embodiments include approaches for determining burn-in workload conditions for an integrated circuit (IC) design. Some embodiments include burn-in testing the IC design using the workload conditions. In some embodiments, a computer implemented method includes obtaining survey data about at least one application workload for an integrated circuit (IC) corresponding to an IC design; generating latch state and clocking statistics about the IC design for the at least one application workload based upon the survey data; and determining a set of burn-in workload conditions for the IC design based upon the latch state and clocking statistics about the IC design.

A first aspect includes a computer implemented method includes obtaining survey data about at least one application workload for an integrated circuit (IC) corresponding to an IC design; generating latch state and clocking statistics about the IC design for the at least one application workload based upon the survey data; and determining a set of burn-in workload conditions for the IC design based upon the latch state and clocking statistics about the IC design.

A second aspect includes a system having: at least one computing device configured to: obtain survey data about at least one application workload for an integrated circuit (IC) corresponding to an IC design; generate latch state and clocking statistics about the IC design for the at least one application workload based upon the survey data; and determine a set of burn-in workload conditions for the IC design based upon the latch state and clocking statistics about the IC design.

A third aspect includes a computer program product having program code stored on a computer-readable storage medium, which when executed by at least one computing device, causes the at least one computing device to: obtain survey data about at least one application workload for an integrated circuit (IC) corresponding to an IC design; generate latch state and clocking statistics about the IC design for the at least one application workload based upon the survey data; and determine a set of burn-in workload conditions for the IC design based upon the latch state and clocking statistics about the IC design.

BRIEF DESCRIPTION OF THE DRAWINGS

FIG. 3 shows an example dataset created to illustrate model burn-in patterns for simulation of an IC design according to various embodiments.

Figure 1:
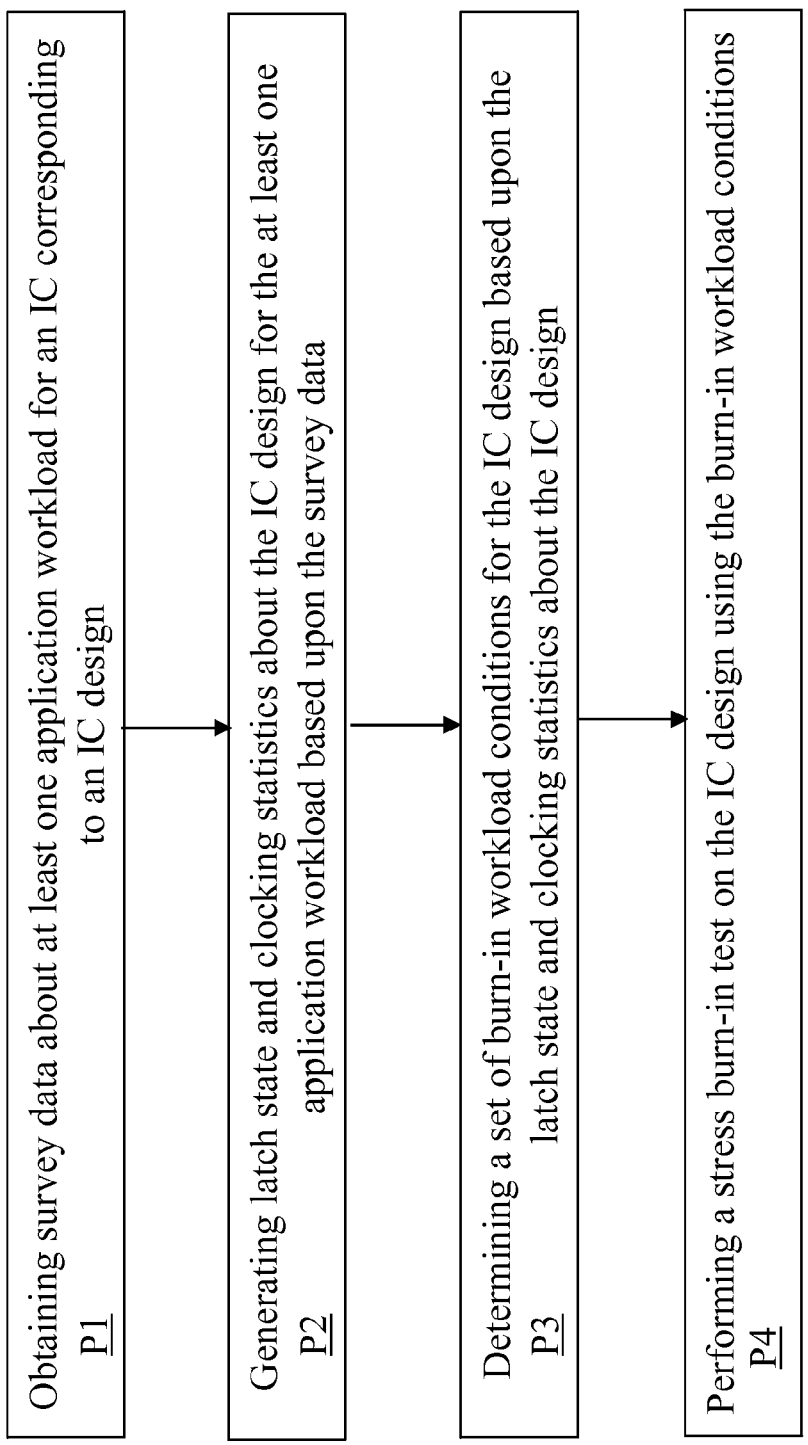
FIG. 1 shows a flow diagram depicting a process according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted herein, aspects of the invention relate generally to integrated circuits. More particularly, various aspects of the invention relate to testing integrated circuits under emulated application conditions.

As described herein, during the stress-inducing process of burn-in, patterns used to exercise an IC (e.g., a microprocessor) in manufacturing are not necessarily representative of how that IC is exercised in the field (e.g., in use for one or more applications). This mismatch between field usage and burn-in leads to unrealistic stressing in the test phase, which can over-stress or under-stress the circuit.

In contrast to conventional approaches, various embodiments include approaches that obtain/compile survey data about an IC running under one or more application(s), and emulate those application conditions to stress test (burn-in test) that IC design. In various embodiments, the survey data about the IC need not be application specific, that is, the survey data may be based upon IC parameters across a plurality of applications. In these cases, emulation may be based upon data gathered across the plurality of applications. In various embodiments, the survey data is obtained from application software running on a set of similarly designed ICs.

Some particular embodiments include method, systems and/or computer program products for performing actions including: obtaining survey data about at least one application workload for an integrated circuit (IC) corresponding to an IC design; generating latch state and clocking statistics about the IC design for the at least one application workload based upon the survey data; and determining a set of burn-in workload conditions for the IC design based upon the latch state and clocking statistics about the IC design.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

Figure 2:
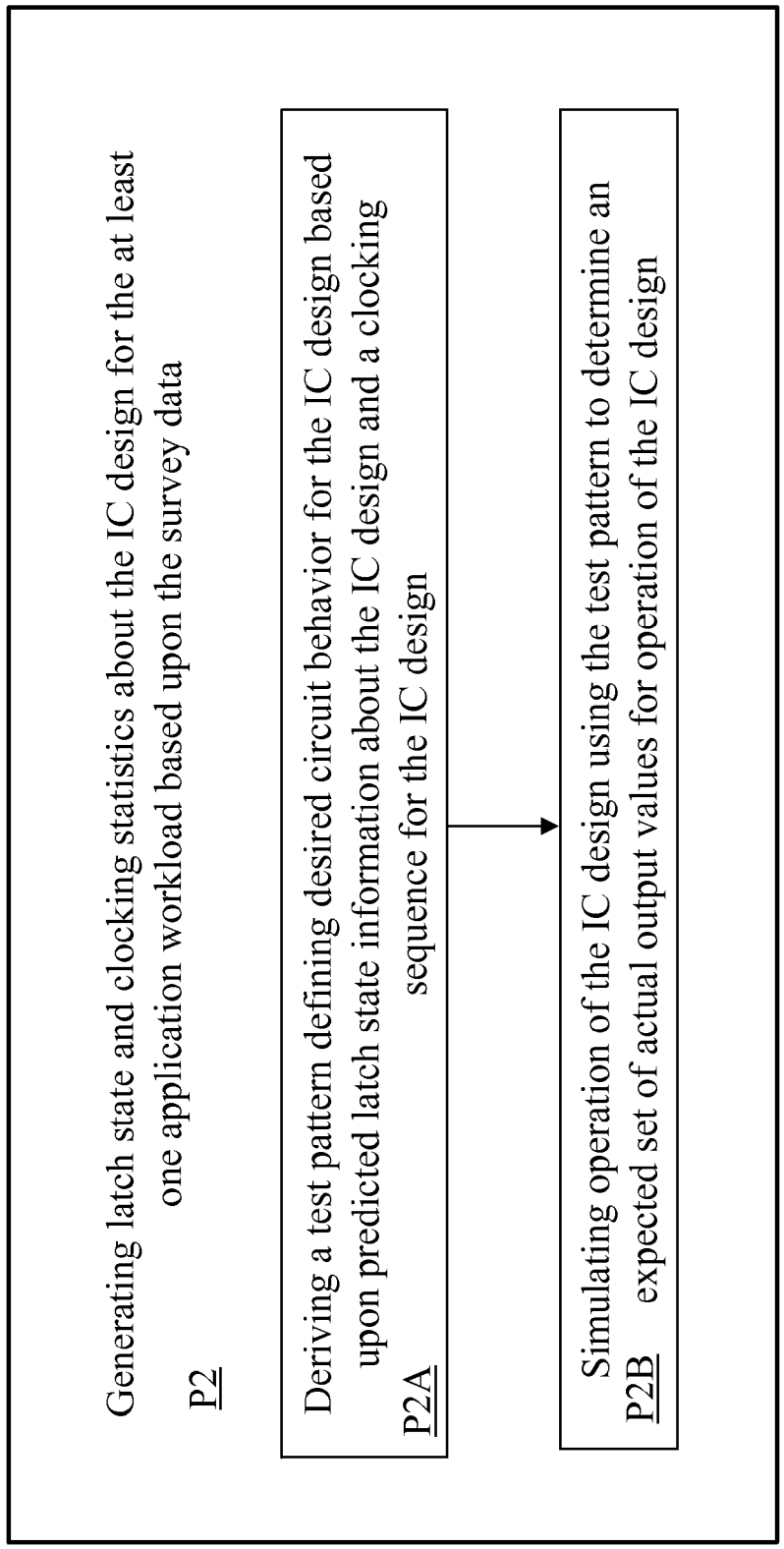
FIG. 2 shows a flow diagram depicting a sub-process from FIG. 1 according to various alternative embodiments.

FIG. 1 depicts a flow diagram illustrating a process flow of a method of determining a set of burn-in workload conditions for an IC design (and in some cases, testing that design via burn-in under those conditions), according to various embodiments. FIG. 2 depicts a flow diagram illustrating sub-processes in the flow of FIG. 1.

Turning to FIG. 1, the flow diagram depicting the method of determining a set of burn-in workload conditions for an IC design can include the following processes:

Process P1: obtaining survey data about at least one application workload for an integrated circuit (IC) corresponding to an IC design. The survey data can include data obtained from application software running on at least one IC having the corresponding IC design. That is, the survey data describes application workloads for at least one physical IC, such as data about physical operation of one or more ICs running the at least one application. Some conventional approaches include simulating test workloads for simulating an IC, and in contrast to those approaches, various embodiments employ survey data obtained from application software running on actual IC(s) (also referred to herein as application data). As described herein, the survey data may be used to determine a set of burn-in workload conditions for the IC design, which may then be used to test the IC design (via burn-in). In various embodiments, the at least one application includes a plurality (e.g., two or more) of applications, which run on the same IC design (although not necessarily the same physical IC).

In any case, after obtaining the survey data about the at least one application workload, the process may further include:

Process P2: generating latch state and clocking statistics about the IC design for the at least one application workload based upon the survey data. Meaningful statistics can indicate the amount of time a latch/register (bit by bit) is in a '0' state vs. a '1' state, and may also include beyond a percentage of time, the number of transitions (0 to 1, 1 to 0) on average over the course of time. Because certain of these elements drive all chip combinatorial logic, they deterministically activate and deactivate subsequent circuitry. Also, useful statistics may indicate the amount of time a combination or pattern of such bits is present vs. being not present. It is not a random combination or any dissociated set of conditions that are being sought. Rather, deterministic combinations of certain latches in a specific state act to either enable or disable subsequent data processing in down stream units. These can be identified by either the inputs to certain latches, the outputs to certain latches, or the combination of events (input activated along with the absence of a controlling clock gate). Events such as these can be identified as control logic or state machines, and specific statistics about these events can be important to creating meaningful stress patterns. Statistical elements of particular significance may need to be so identified as such as a matter of design practice and utilized precisely for appropriate stress pattern generation. As described herein, process P2 can include a plurality of sub-processes, illustrated in the flow diagram of FIG. 2. As shown, process P2 can include the following sub-processes:

Process P2A: deriving a test pattern defining desired circuit behavior for the IC design based upon predicted latch state information about the IC design and a clocking sequence for the IC design. In various embodiments, the predicted latch state information includes information about latches in two distinct categories including: pervasive latches; and functional latches.

Pervasive latches can be predictable based upon knowledge of the latch state in a given application or set of applications. For example, in latch state (mode) X, pervasive latches are deterministic, e.g., set at 0, set at 1, or toggling in a predictable fashion (25%, 50%, 75%, etc.).

The functional latches can include two distinct sub-categories including: A) control logic latches; and B) data flow structure latches. Control logic latches can be implemented in a plurality of manners, all of which follow a similar pattern. The control logic latch has an idle state, and through one or more sequences, eventually returns to idle. The idle state for a control logic latch can be based on the type of application, and can involve extended periods at idle, or transient periods at idle. In some cases, the idle state will have the most variability in terms of stress state. If implemented as one latch per state (and only one latch active at a time), the duty cycle characteristics of each latch may be bound. Idle and stall states may be stressed as a "1" active state a higher percentage of the time than other states. These other states (pass-through states) can have a low duty cycle in the "1" state in such a structure. Knowledge of the activity level of the IC, based upon the application (or other queue characteristics), can help in determining the stress level(s) of the control logic. For example, low activity levels can indicate that the idle state is experiencing a high duty cycle (or is stuck at "1" too often), and other pass-through states have a low duty cycle based upon being activated rarely and returning to (0) most of the time. In this example, stall states are stressed proportionately a bit higher than pass-through states, and are in the (1) condition a higher percentage of the time.

Data flow structure latches can be more prevalent in an IC design, but may be harder to predict in terms of time spent in a particular state. However, similar to control logic, with knowledge of the IC design, including hold and/or return characteristics, the duty cycle can be bounded. For example, using a deeply piped structure (e.g., part of a processing unit, data command, memory controller data-flow, cross-bar switch, staging latches in a wide data-bus structure, etc.), a power-on state for all latches is traditionally '0.' Over time, as activity lights up the data structures in the IC, true I/O data (random data) starts flowing through the data structures in the IC. In many cases, the data flow stalls for one or more reasons, which clogs the pipe. The nature of this data is that it cannot be lost—it must be maintained (at least as long as it is valid data either before being executed or stored or otherwise passed on to another unit). However, once the pipe is cleared or empty (or empty from a particular stage on), the designer (human designer) of the IC has a choice as to what to do with the latch states. Often, for the purpose of minimizing workload for the designer, contents can be left as is, with entries simply being marked as invalid but the location still contains a random set of ones (1's) and zeros (0's). Alternatively, when the contents are not valid, they can be nulled out (to all 0's, to all 1's or to any value desired). Based on this information, it is possible to bound how much time a set of data flow latches are actively working with random data, and how much time the set of data flow latches are either left with random data or returned to a reset state.

Data flow structures also contend with branch situations where the path of the data goes to 1 of N possible paths before eventually coming back to a common point or dead ending (as in speculative operations that are eventually discarded). But in such situations, generally, only one path is active and gets the meaningful data for executing a function. All other branches contain either null data (no data) or are attempting to perform a parallel operation that is in competition with the primary (real) operation. As such, the time any given branch is working on meaningful data is proportionately diminished by the number of possible branches the data may take. Some will be more active than others (not all branches have an equal chance of working on the data, in most cases anyway). How busy a particular data flow structure or unit in an IC will be can vary by application. However, both conventional simulation and hardware running real software can provide tools that help determine the activity level of any given unit on the IC design when a particular application is being used. Cycle simulation-based tools can provide statistics directly on the activity level of individual latches or on sets of latches or of units in general. However, it may not be practical to simulate every possible application. In physical hardware, precise metrics on individual latches may not be possible (or practical), but performance monitors can provide the general function necessary to determine how busy a unit is, a command flow is, a specific data flow, and even branch statistics. Such information, along with knowledge about the design characteristics of the IC, can allow for calculation of duty cycle information within reasonable bounds.

In any case, following process P2A (deriving a test pattern defining desired circuit behavior for the IC design . . . ) process P2 can also include:

Process P2B: simulating operation of the IC design using the test pattern to determine an expected set of actual output values for operation of the IC design.

Returning to FIG. 1, the general process flow (after process P2, generating latch state and clocking statistics) can proceed to:

Process P3: determining a set of burn-in workload conditions for the IC design based upon the latch state and clocking statistics about the IC design. In various embodiments, determining the set of burn-in workload conditions for the IC design includes combining the expected set of actual output values with the test pattern to create the set of burn-in workload conditions for the IC design. FIG. 3 shows an example dataset created to illustrate model burn-in patterns for simulation of an IC design. In some cases, for example, in the case shown, each latch has low and high bounds, and the burn-in pattern is developed to test low bounds, high bounds and stress components in the IC design to understand impacts on the IC.

Following determining the set of burn-in workload conditions, in some cases, a burn-in test is performed using those workload conditions:

Process P4 (optional post-process): performing a stress burn-in test on the IC design using the burn-in workload conditions. This process can be performed using conventional burn-in software programs, and can be executed using the developed burn-in workload conditions as inputs to the testing software.

Figure 4:
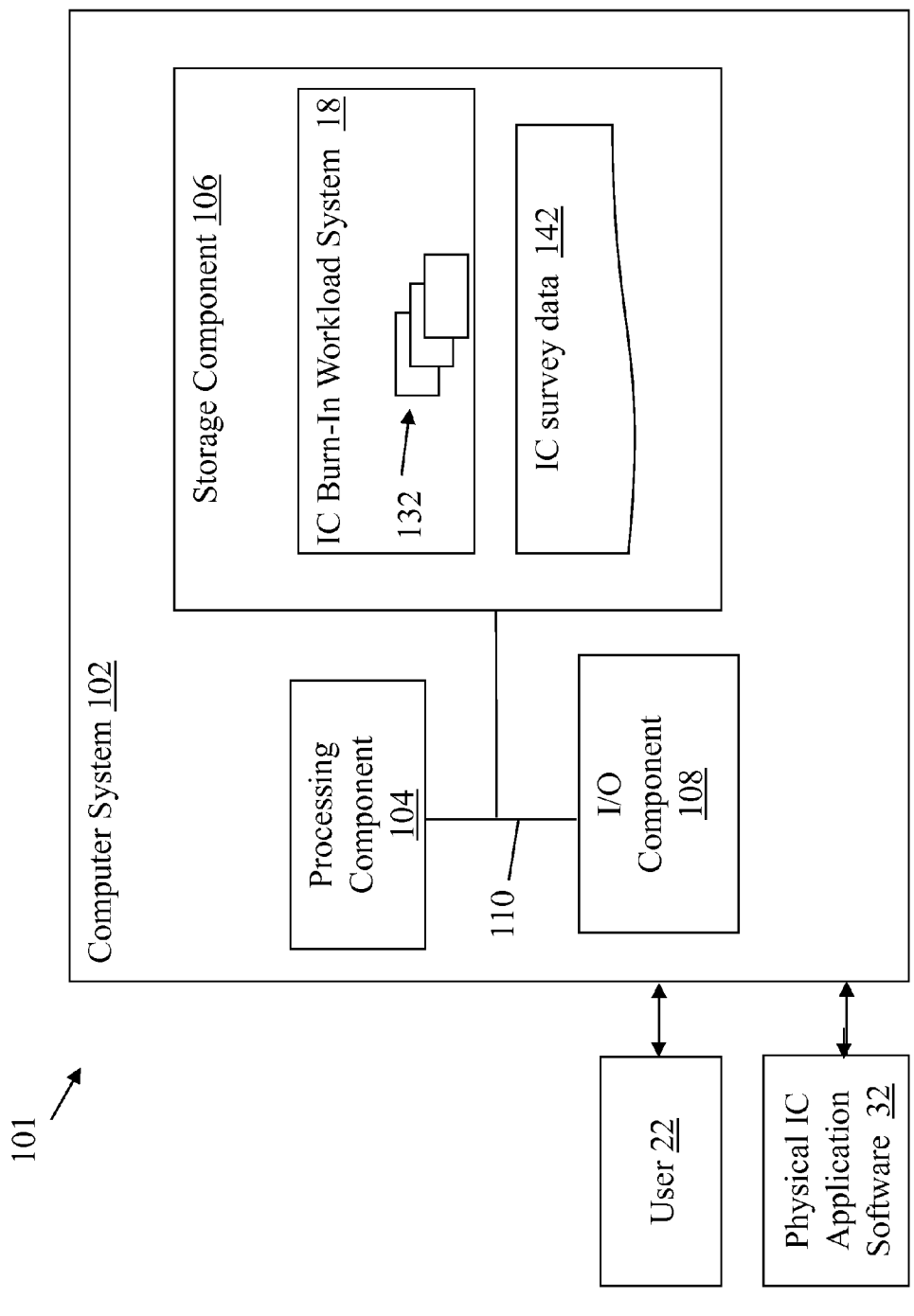
FIG. 4 shows a schematic environment for implementing an IC burn-in workload system according to various embodiments.

FIG. 4 depicts an illustrative environment 101 for determining a chip burn-in workload based upon emulated application condition(s) according to embodiments. To this extent, the environment 101 includes a computer system 102 that can perform a process described herein in order to determine a chip burn-in workload based upon emulated application conditions. In particular, the computer system 102 is shown as including an integrated circuit (IC) burn-in workload system 18, which makes computer system 102 operable to determine a chip burn-in workload based upon emulated application condition(s) by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the IC burn-in workload system 18, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human or other user) 22 (e.g., an IC developer, software programmer, etc.) and the physical IC application software 32 to interact with the computer system 102 and/or one or more communications devices to enable a system user 22 and/or the physical IC application software 32 to communicate with the computer system 102 using any type of communications link. To this extent, the IC burn-in workload system 18 can manage a set of interfaces (e.g., graphical user interface(s), application program interface, etc.) that enable human and/or system users 22 to interact with the IC burn-in workload system 18, and allow the physical IC application software 32 to communicate IC survey data 142 (physical IC application data, e.g., clocking data, latch data, etc.) to the IC burn-in workload system 18. Further, the IC burn-in workload system 18 can manage (e.g., store, retrieve, create, manipulate, organize, present, etc.) data, such as IC survey data 142 via any solution.

In any event, the computer system 102 can comprise one or more general purpose computing articles of manufacture (e.g., computing devices) capable of executing program code, such as the IC burn-in workload system 18, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the IC burn-in workload system 18 can be embodied as any combination of system software and/or application software.

Further, the IC burn-in workload system 18 can be implemented using a set of modules 132. In this case, a module 132 can enable the computer system 102 to perform a set of tasks used by the IC burn-in workload system 18, and can be separately developed and/or implemented apart from other portions of the IC burn-in workload system 18. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of IC burn-in workload system 18 fixed thereon (e.g., one or more modules 132). However, it is understood that the computer system 102 and IC burn-in workload system 18 are only representative of various possible equivalent computer systems that may perform a process described herein. To this extent, in other embodiments, the functionality provided by the computer system 102 and IC burn-in workload system 18 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as IC survey data 142 using any solution. For example, the computer system 102 can generate and/or be used to retrieve IC survey data 142 from one or more data stores, receive IC survey data 142 from another system, send IC survey data 142 to another system, etc.

While shown and described herein as methods, systems, and computer program products for determining an IC burn-in workload for an IC design, it is understood that aspects of the invention further provide various alternative embodiments. For example, in one embodiment, the invention provides a computer program fixed in at least one computer-readable medium, which when executed, enables a computer system to determine an IC burn-in workload for an IC design. To this extent, the computer-readable medium includes program code, such as the IC burn-in workload system 18 (FIG. 4), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the IC burn-in workload system 18 (FIG. 4), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for determining an IC burn-in workload for an IC design. In this case, a computer system, such as the computer system 102 (FIG. 4), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

It is understood that aspects of the invention can be implemented as part of a business method that performs a process described herein on a subscription, advertising, and/or fee basis. That is, a service provider could offer to provide an IC burn-in workload system as described herein. In this case, the service provider can manage (e.g., create, maintain, support, etc.) a computer system, such as computer system 102 (FIG. 4), that performs a process described herein for one or more customers. In return, the service provider can receive payment from the customer(s) under a subscription and/or fee agreement, receive payment from the sale of advertising to one or more third parties, and/or the like.

In various embodiments, components described as being "coupled" to one another can be joined along one or more interfaces. In some embodiments, these interfaces can include junctions between distinct components, and in other cases, these interfaces can include a solidly and/or integrally formed interconnection. That is, in some cases, components that are "coupled" to one another can be simultaneously formed to define a single continuous member. However, in other embodiments, these coupled components can be formed as separate members and be subsequently joined through known processes (e.g., fastening, ultrasonic welding, bonding).

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

We claim:

1. A computer-implemented method, performed on at least one computing device, the computer-implemented method comprising:
   obtaining survey data about at least one application workload for an integrated circuit (IC) corresponding to an IC design;
   generating latch state and clocking statistics about the IC design for the at least one application workload based upon the survey data using the at least one computing device; and
   determining a set of burn-in workload conditions for the IC design based upon the latch state and clocking statistics about the IC design.

2. The computer-implemented method of claim 1, further comprising performing a stress burn-in test on the IC design using the burn-in workload conditions.

3. The computer-implemented method of claim 1, wherein the at least one application workload for the IC includes data about physical operation of the IC according to the at least one application.

4. The computer-implemented method of claim 1, wherein the at least one application includes a plurality of applications, and the latch state and clocking statistics about the IC design include latch state and clocking statistics for each of the plurality of applications.

5. The computer-implemented method of claim 1, wherein the generating of the latch state and clocking statistics about the IC design includes:
   deriving a test pattern defining desired circuit behavior for the IC design based upon predicted latch state information about the IC design and a clocking sequence for the IC design; and
   simulating operation of the IC design using the test pattern to determine an expected set of actual output values for operation of the IC design.

6. The computer-implemented method of claim 5, wherein the determining of the set of burn-in workload conditions for the IC design includes combining the expected set of actual output values with the test pattern to create the set of burn-in workload conditions for the IC design.

7. The computer-implemented method of claim 5, wherein the predicted latch state information includes information about latches in two distinct categories including: pervasive latches; and functional latches.

8. The computer-implemented method of claim 7, wherein the functional latches include two distinct sub-categories including: control logic latches; and data flow structure latches.

9. A system comprising:
   at least one computing device configured to:
   obtain survey data about at least one application workload for an integrated circuit (IC) corresponding to an IC design;
   generate latch state and clocking statistics about the IC design for the at least one application workload based upon the survey data; and
   determine a set of burn-in workload conditions for the IC design based upon the latch state and clocking statistics about the IC design.

10. The system of claim 9, wherein the at lest one computing device is further configured to perform a stress burn-in test on the IC design using the burn-in workload conditions.

11. The system of claim 9, wherein the generating of the latch state and clocking statistics about the IC design includes:
   deriving a test pattern defining desired circuit behavior for the IC design based upon predicted latch state information about the IC design and a clocking sequence for the IC design; and
   simulating operation of the IC design using the test pattern to determine an expected set of actual output values for operation of the IC design.

12. The system of claim 11, wherein the determining of the set of burn-in workload conditions for the IC design includes combining the expected set of actual output values with the test pattern to create the set of burn-in workload conditions for the IC design.

13. The system of claim 11, wherein the predicted latch state information includes information about latches in two distinct categories including: pervasive latches; and functional latches.

14. The system of claim 13, wherein the functional latches include two distinct sub-categories including: control logic latches; and data flow structure latches.

15. A computer program product comprising program code stored on a non-transitory computer-readable medium, which when executed by at least one computing device, causes the at least one computing device to:
   obtain survey data about at least one application workload for an integrated circuit (IC) corresponding to an IC design;
   generate latch state and clocking statistics about the IC design for the at least one application workload based upon the survey data; and
   determine a set of burn-in workload conditions for the IC design based upon the latch state and clocking statistics about the IC design.

16. The computer program product of claim 15, wherein the at lest one computing device is further configured to perform a stress burn-in test on the IC design using the burn-in workload conditions.

17. The computer program product of claim 15, wherein the generating of the latch state and clocking statistics about the IC design includes:
   deriving a test pattern defining desired circuit behavior for the IC design based upon predicted latch state information about the IC design and a clocking sequence for the IC design; and
   simulating operation of the IC design using the test pattern to determine an expected set of actual output values for operation of the IC design.

18. The computer program product of claim 17, wherein the determining of the set of burn-in workload conditions for the IC design includes combining the expected set of actual output values with the test pattern to create the set of burn-in workload conditions for the IC design.

19. The computer program product of claim 17, wherein the predicted latch state information includes information about latches in two distinct categories including: pervasive latches; and functional latches.

20. The computer program product of claim 19, wherein the functional latches include two distinct sub-categories including: control logic latches; and data flow structure latches.

* * * * *